United States Patent
Lin et al.

(10) Patent No.: US 8,427,229 B2
(45) Date of Patent: Apr. 23, 2013

(54) INTEGRATED CIRCUITS WITH BI-DIRECTIONAL CHARGE PUMPS

(75) Inventors: Yvonne Lin, Saratoga, CA (US); Tien-Chun Yang, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 132 days.

(21) Appl. No.: 13/038,519

(22) Filed: Mar. 2, 2011

(65) Prior Publication Data

US 2012/0223766 A1    Sep. 6, 2012

(51) Int. Cl.
  *G05F 1/10*    (2006.01)
  *G05F 3/02*    (2006.01)

(52) U.S. Cl.
  USPC ............................... 327/536; 327/537; 363/60

(58) Field of Classification Search .................. 327/148, 327/157, 534–537; 363/59, 60
  See application file for complete search history.

(56) References Cited

U.S. PATENT DOCUMENTS

| | | | |
|---|---|---|---|
| 5,306,954 A | | 4/1994 | Chan et al. |
| 5,812,018 A | * | 9/1998 | Sudo et al. .................... 327/537 |
| 5,907,484 A | * | 5/1999 | Kowshik et al. ................ 363/60 |
| 6,023,188 A | * | 2/2000 | Lee et al. ....................... 327/536 |
| 6,184,741 B1 | * | 2/2001 | Ghilardelli et al. ............ 327/536 |
| 2001/0022735 A1 | * | 9/2001 | Zanuccoli et al. .............. 363/60 |
| 2006/0273843 A1 | * | 12/2006 | Daga et al. ..................... 327/536 |
| 2008/0186081 A1 | * | 8/2008 | Yamahira et al. ............. 327/536 |
| 2011/0169557 A1 | * | 7/2011 | Yamahira et al. ............. 327/536 |

OTHER PUBLICATIONS

Mohammad, M.Gh. et al., "Switched positive/negative charge pump design using standard CMOS transistors", IET Circuits Devices Syst., 2010, 4(1):57-66.

* cited by examiner

*Primary Examiner* — Lincoln Donovan
*Assistant Examiner* — Brandon S Cole
(74) *Attorney, Agent, or Firm* — Duane Morris LLP

(57) ABSTRACT

Integrated circuits such as memory arrays are coupled to a bi-directional charge pump that includes an input circuit and output circuit, and one or more pump stages coupled between the input circuit and the output circuit of the bi-directional charge pump. The output circuit includes a diode having an input and output and a transistor connected to the output of the diode and a ground potential. The input of the diode is electrically connected to the pump stages in a configuration that allows the charge pump to apply a positive or negative voltage to the memory array or other load.

26 Claims, 12 Drawing Sheets

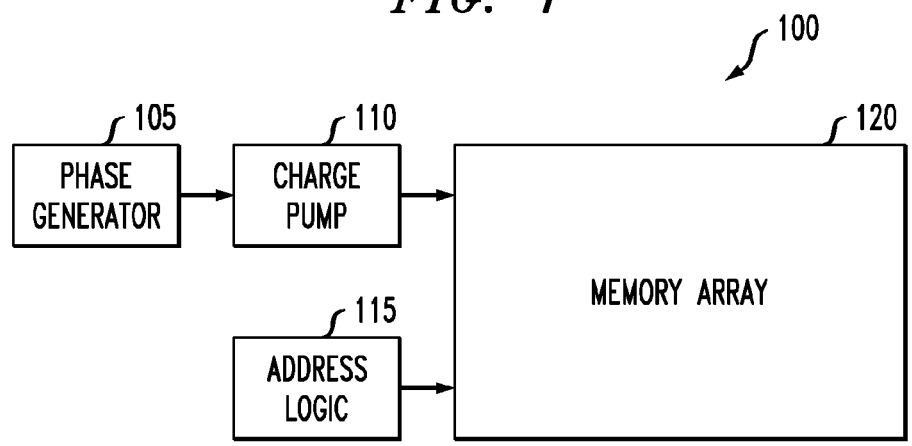
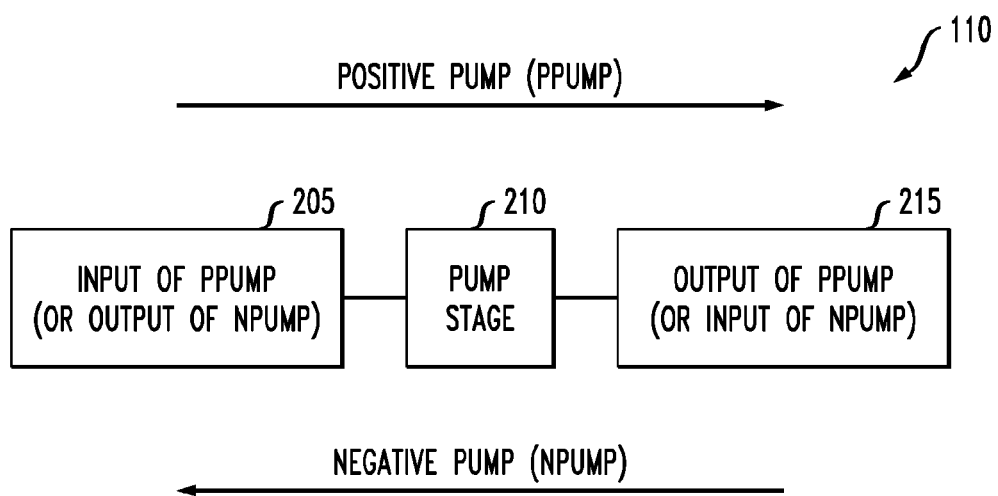

FIG. 15
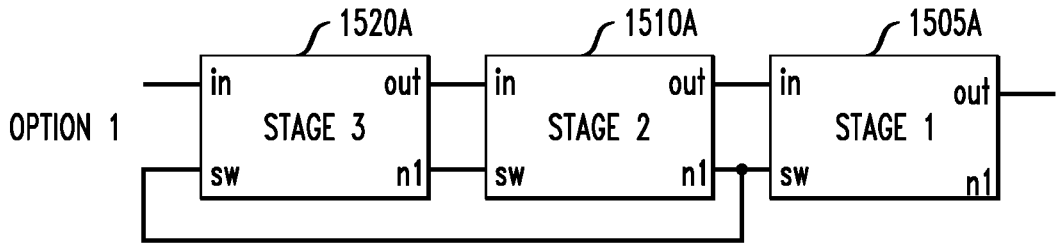
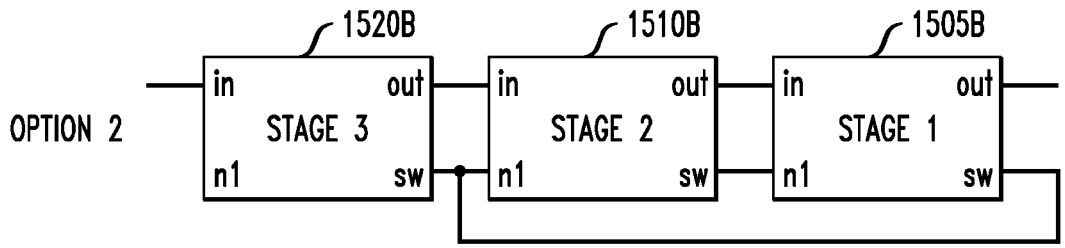
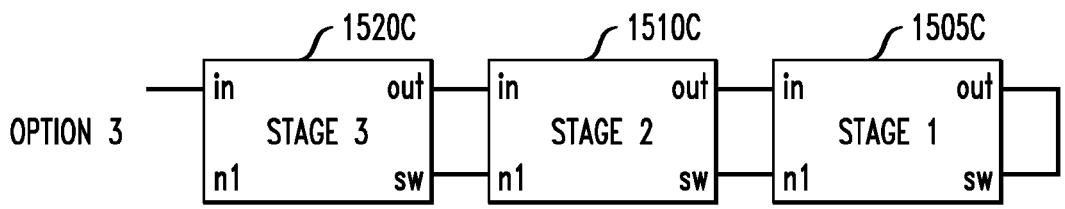
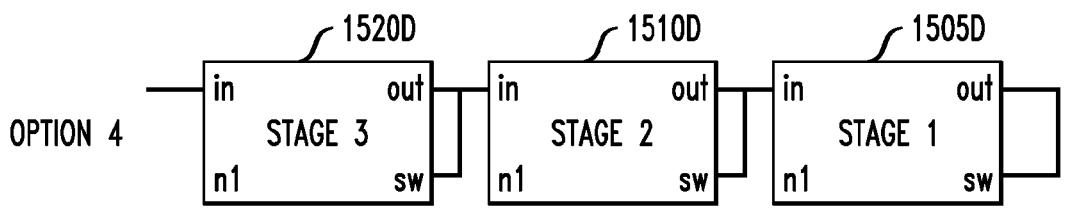

INTEGRATED CIRCUITS WITH BI-DIRECTIONAL CHARGE PUMPS

BACKGROUND

Flash memory devices can be operated using both positive & negative voltages from positive and negative pumps, which are also called bi-directional charge pumps. Such positive and negative pumps are typically separate devices that consume physical area on the flash memory integrated circuit or circuits. Bi-directional charge pumps are configured such that the same voltage magnitudes are applied for the negative pumps (NPumps) and the positive pumps (PPumps). The devices do not generate different magnitude voltages, such as −15V and +7V. Bi-directional charge pumps also do not generate both positive and negative voltages at the same time.

Desirable in the art is an improved bi-directional charge pump that improves conventional bi-directional charge pumps as to these and other aspects.

BRIEF DESCRIPTION OF THE DRAWINGS

The accompanying drawings illustrate preferred embodiments of the invention, as well as other information pertinent to the present disclosure, in which:

FIG. 1 is a block diagram that illustrates an integrated circuit having a bi-directional charge pump in accordance with an embodiment of the present disclosure;

FIG. 2 is a high-level block diagram that illustrates an embodiment of a bi-directional charge pump, such as that shown in FIG. 1;

FIGS. 15 and 16 are block diagrams that illustrate embodiments of various arrangements of pump stages, such as that shown in FIG. 12.

DETAILED DESCRIPTION

Figure 3:
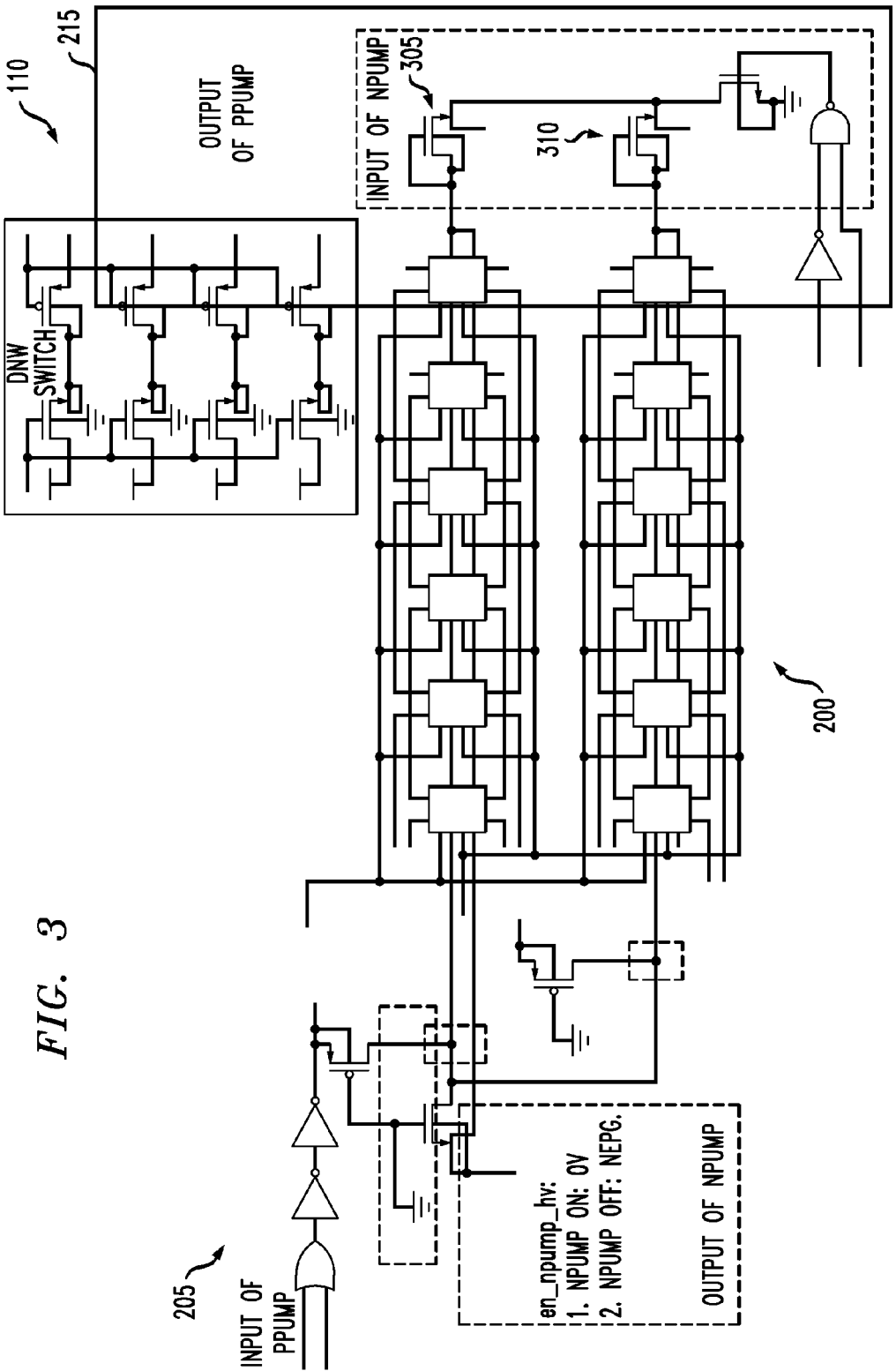
FIG. 3 is a more detailed block diagram that illustrates an embodiment of a bi-directional charge pump, such as that shown in FIG. 2, illustrating and example of output elements of a positive pump (or input elements of a negative pump)

Exemplary systems are discussed with reference to the figures. Although these systems are described in detail, they are provided for purposes of illustration only and various modifications are feasible within the scope of the appended claims.

FIG. 1 is a block diagram that illustrates an integrated circuit 100 having a bi-directional charge pump 110 in accordance with an embodiment of the present disclosure. The integrated circuit 100 can be applied to memory devices, such as flash memory devices. In general, the integrated circuit 100 includes a phase generator 105, a bi-directional charge pump 110, an address logic portion 115, and a memory array 120. In this example, the memory array 120 is a load circuit the bi-directional charge pump 110 is connected to. The phase generator 105 outputs phase pulse signals to the bi-directional charge pump 110, which outputs positive and negative voltages to the memory array 120 with timing based on the phase pulse signals. The address logic 115 is electrically connected to the memory array 120 and can be used to access memory cells of the memory array 120 selectively. The bi-directional charge pump 110 and the address logic 115 can be used to effect switching and addressing functions. These include, for example, read and write functions, address pre-decode for selecting, for example, a word line driver, chip enable/disable functions, self timing generation, and communication through input/output (I/O) arrays, among others.

FIG. 2 is a high-level block diagram that illustrates an embodiment of a bi-directional charge pump 110, such as that shown in FIG. 1. In general, the bi-directional charge pump 110 includes an input circuit 205 for a positive pump, one or more pump stages 210, and an output circuit 215 for the positive pump. In the case of a negative pump, the input and output circuitries 205, 215 of the positive pump are reversed and comprise the output and input circuits 205, 215, respectively, of the negative pump.

FIG. 3 is a more detailed block diagram that illustrates an embodiment of a bi-directional charge pump 110, such as that shown in FIG. 2, having an output circuit 215 of a positive pump (or an input circuit 215 of a negative pump). The one or more pump stages 210 include six (6) pump stages in this example. The output circuit 215 of a positive pump includes diode circuits 305, 310 that are electrically connected to the pump stage 210. The diode circuits 305, 310 are described in more detail in connection with FIGS. 4-5.

Figure 4:
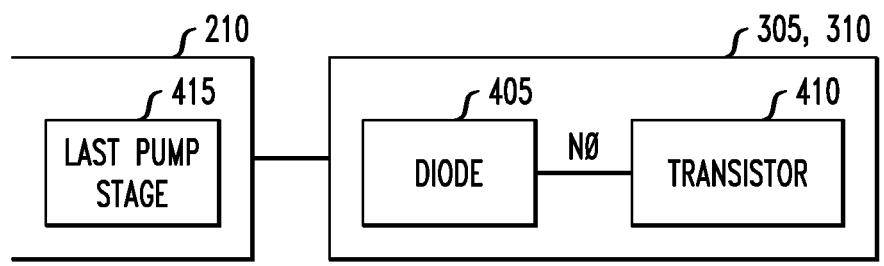
FIG. 4 is a block diagram that illustrates an embodiment of an output circuit of a positive pump, such as that shown in FIG. 3, comprising a diode configuration.
Figure 5:
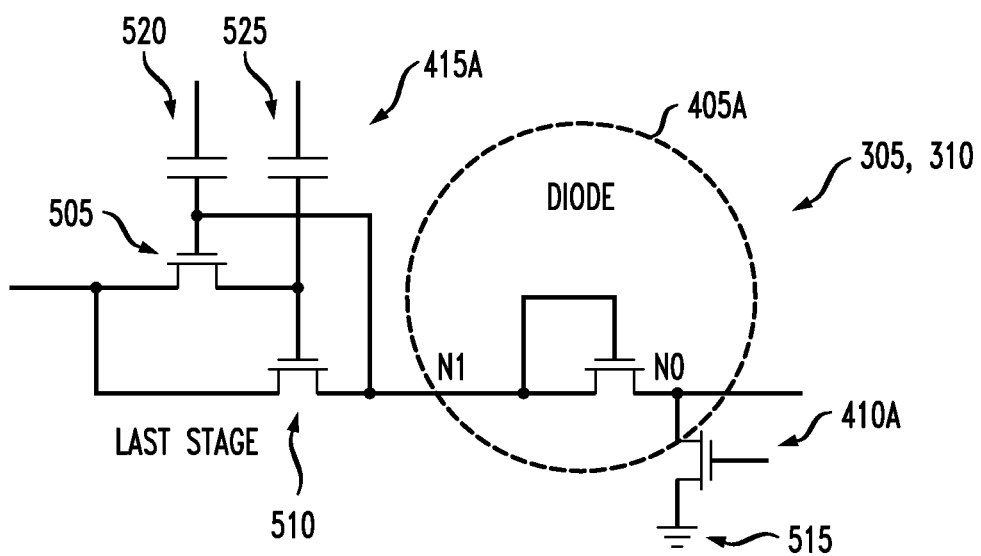
FIG. 5 is a schematic diagram that illustrates an embodiment for a diode circuit such as that shown in FIG. 4.

FIG. 4 is a block diagram that illustrates an embodiment of an output circuit 215 of a positive pump, such as that shown in FIG. 3, having a diode circuit 305, 310. The diode circuits 305, 310 are connected to the pump stage 210 and can be connected to a last pump stage 415. Each diode circuit 305, 310 includes a diode 405 that is electrically connected to a transistor 410. The diode 405 includes an input and output, and the transistor 410 is connected to the output of the diode 405 and to a ground potential 515 (FIG. 5). The input of the diode 405 is electrically connected to the pump stages 210 and can be connected to the last pump stage 415.

A positive voltage can be applied at the input of the diode 405 and can switch on the diode 405, which discharges the positive voltage through the transistor 410 to the ground potential (not shown) and provides a positive pump (P-Pump) at node N0 that is located between the diode 405 and the transistor 410. The P-Pump can be used as an input voltage of a positive pump; whereas, a negative voltage at the input of the diode 405 does not switch on the diode 405 and can remain at the input of the diode 405 as reverse biased. The negative voltage provides a negative pump (N-Pump), which can be used as an input voltage of a negative pump. The diode 405 and the transistor 410 are further described below.

FIG. 5 is a schematic diagram that illustrates an embodiment of a diode circuit 305, 310, such as that shown in FIG. 4.

In this example, the diode circuit 305, 310 includes an NMOS transistor 405A that is configured to function as a diode. The NMOS transistor 405A includes a source, gate, and drain terminals in which the source and gate terminals are electrically connected to a last pump stage 415A and the drain terminal is electrically connected to the transistor 410A. The transistor 410A includes an NMOS transistor having a gate terminal, source terminal, and drain terminal. The source and drain terminals of the transistor 410A are electrically connected to the diode 405A and the ground potential 515, respectively. The last pump stage 415A includes two deep N-well transistors 505, 510 that are connected to each other at their drain terminals and at their source and gate terminals, respectively. The deep N-well transistors 505, 510 are further described in connection with FIGS. 6 and 7.

In a negative pump mode, the pump stage 415A can be termed a first pump stage. Boosting caps 520, 525 can be charged with the aid of the diode circuit 305, 310, which equivalently adds one pump stage for a negative pump. That is, with the diode circuit 305, 310, the output of the pump stages in the negative pump mode can be more negative by one VDD voltage level.

Figure 6:
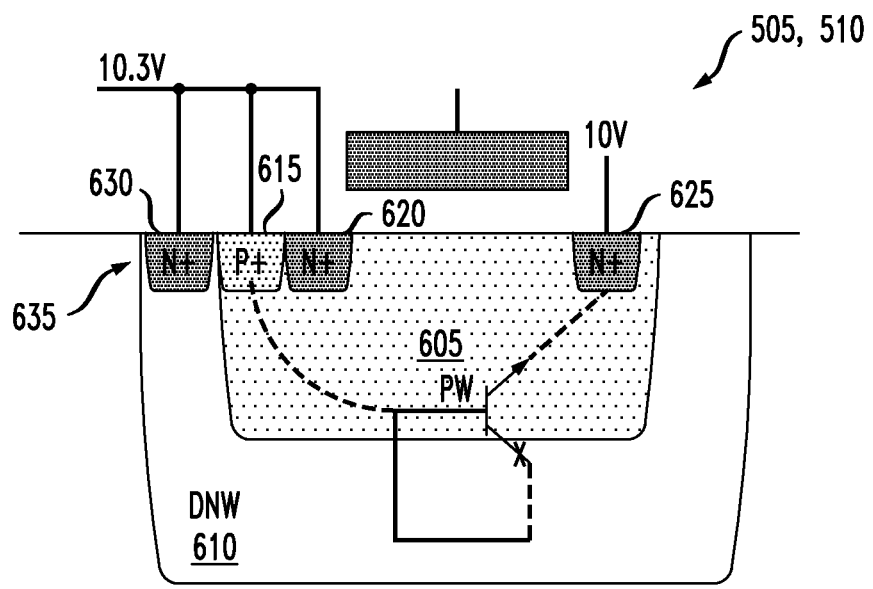
FIGS. 6 and 7 illustrate examples of structures of deep N-well transistors, such as that shown in FIG. 5, that can be included in a pump stage of a bi-directional charge pump.
Figure 7:
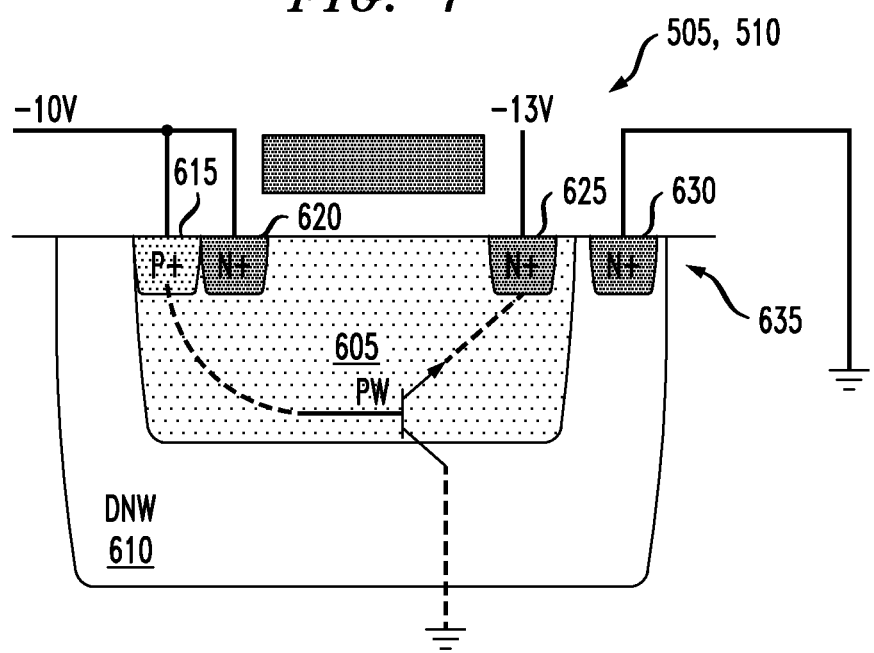

FIGS. 6 and 7 illustrate examples of structures of deep N-well transistors 505, 510, such as that shown in FIG. 5, that are included in a pump stage 415A of a bi-directional charge pump 110. Each pump stage 210 includes one or more deep N-well transistors 505, 510. Each of the deep N-well transistors 505, 510 is structured to include a P-well 605, a deep N-well 610, and multiple N+ and P+ type semiconductor materials 615, 620, 625, 630. The P-well 605 is embedded within the deep N-well 610. The multiple N+ and P+ type semiconductor materials 615, 620, 625, 630 are embedded within the P-well 605 and the deep N-well 610, respectively, and located adjacent to a top surface 635 of the P-well 605 and the deep N-well 610. The multiple N+ and P+ type semiconductor materials include NPNN layer pellets 630, 615, 620, 625 shown in FIGS. 6 and 7. The PNN pellets 615, 620, 625 and the other N pellet 630 are embedded in the P-well 605 and the deep N-well 610, respectively.

In FIG. 6, the deep N-well transistors 505, 510 operate in a positive pump mode and are configured to avoid body effect and bipolar turn on. This can be achieved by tying the N pellet 630 of the deep N-well 610 to the P-well 605 via a deep N-well switch 815, 820, 905 (FIGS. 8 and 9).

In FIG. 7, the deep N-well transistors 505, 510 operate in a negative pump mode and are configured to be biased using negative voltages. This can be achieved by tying the N pellet 630 to the ground potential 515 via the deep N-well switch 815, 820, 905. In addition, it should be noted that the deep N-well switch 815, 820, 905 can be used to break a pump stage into two pumps—one positive pump and one negative pump. The deep N-well switch 815, 820, 905 is further described in connection with FIGS. 8 and 9

Figure 8:
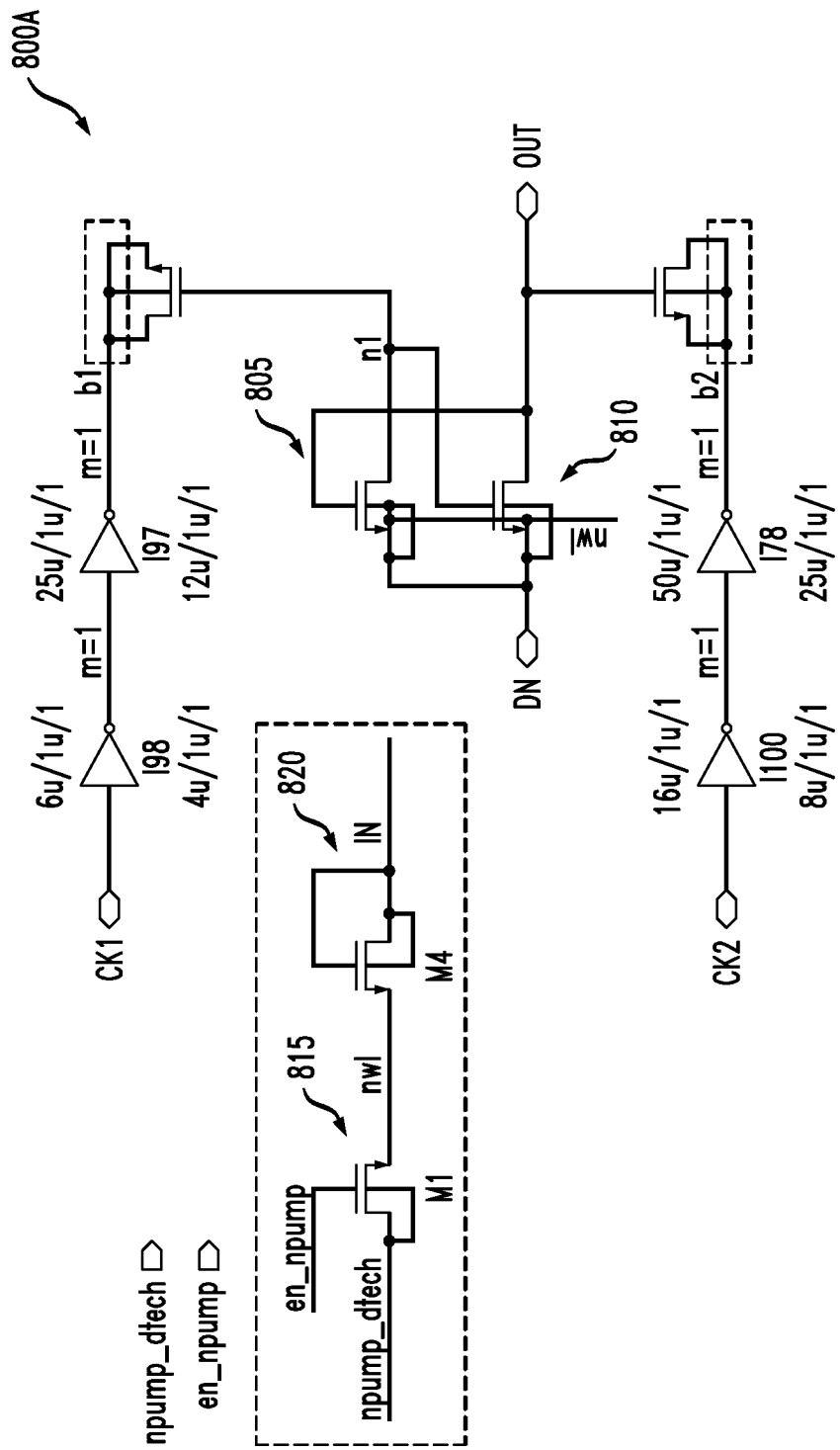
FIGS. 8 and 9 are schematic diagrams that illustrate embodiments of a deep N-well switch that is electrically connected to deep N-well transistors of a pump stage, such as that shown in FIG. 5.
Figure 9:
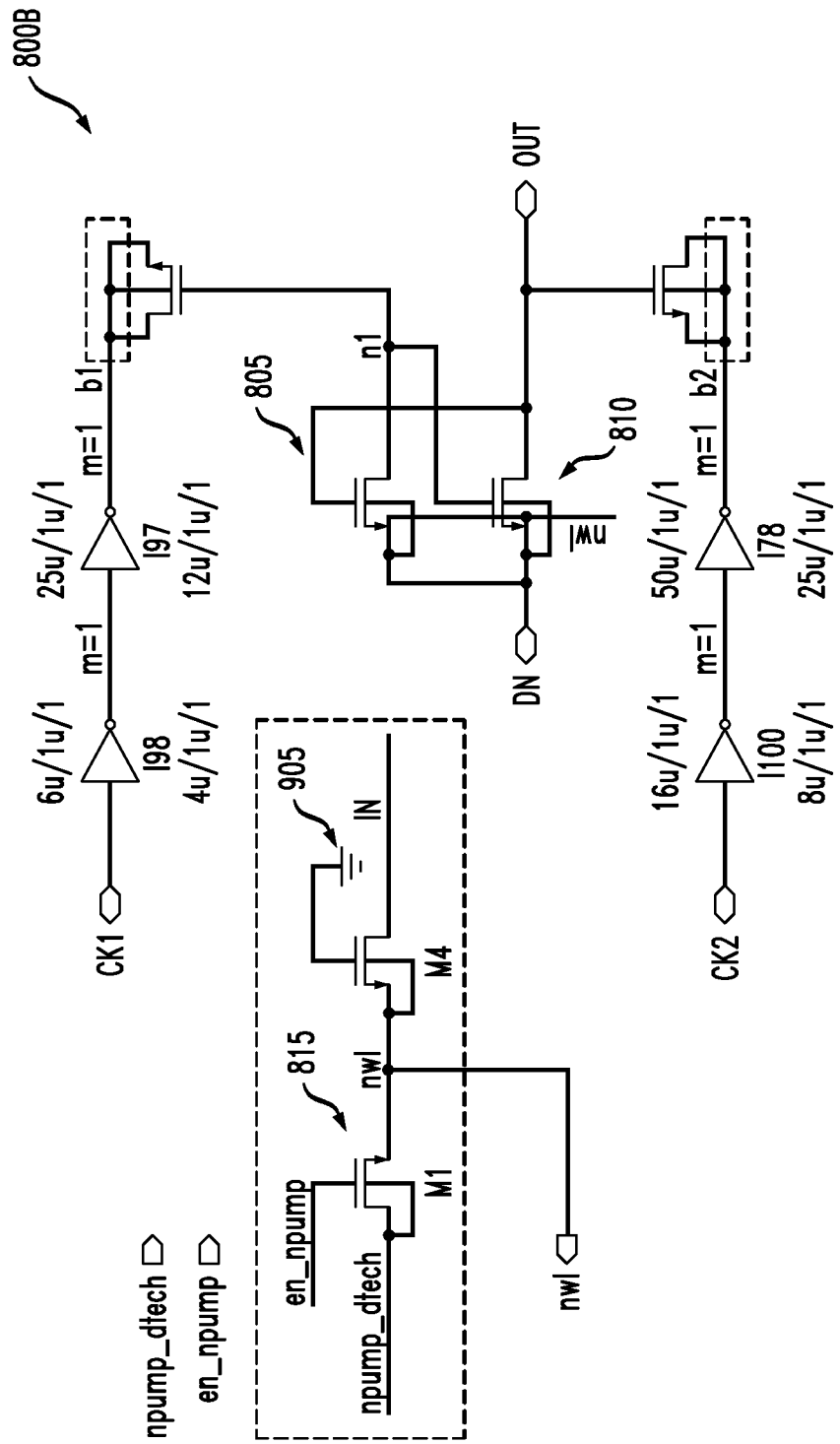

FIGS. 8 and 9 are schematic diagrams that illustrate embodiments of a deep N-well switch 815, 820, 905 that is electrically connected to deep N-well transistors 805, 810 of a pump stage 800A, such as that shown in FIG. 5. The pump stage 800A, B includes a first deep N-well switch 815 and a second deep N-well switch 820, 905 that are electrically connected together at their respective source terminal and drain terminal. In a positive pump mode, the first deep N-well switch 815 turns on and the second deep N-well switch 820, 905 turns off to connect the P-well 605 (FIG. 6) to the deep N-well 610 (FIG. 6) of the deep N-well transistors 805, 810 via the N pellet 630 (FIG. 6) of the deep N-well 610 and the PN pellets 615, 620 of the P-well 605.

In a negative pump mode, the second deep N-well switch 820, 905 turns on and the first deep N-well switch 815 turns off to connect the deep N-well transistors 805, 810 to the ground potential 515 (not shown) via the N pellet 630 of the deep N-well 610 of the deep N-well transistors 805, 810. The first deep N-well switch 815 and the second deep N-well switch 820 can include, but are not limited to, NMOS transistors 815, 820 (FIG. 8) and PMOS transistors 905 (FIG. 9).

Figure 10:
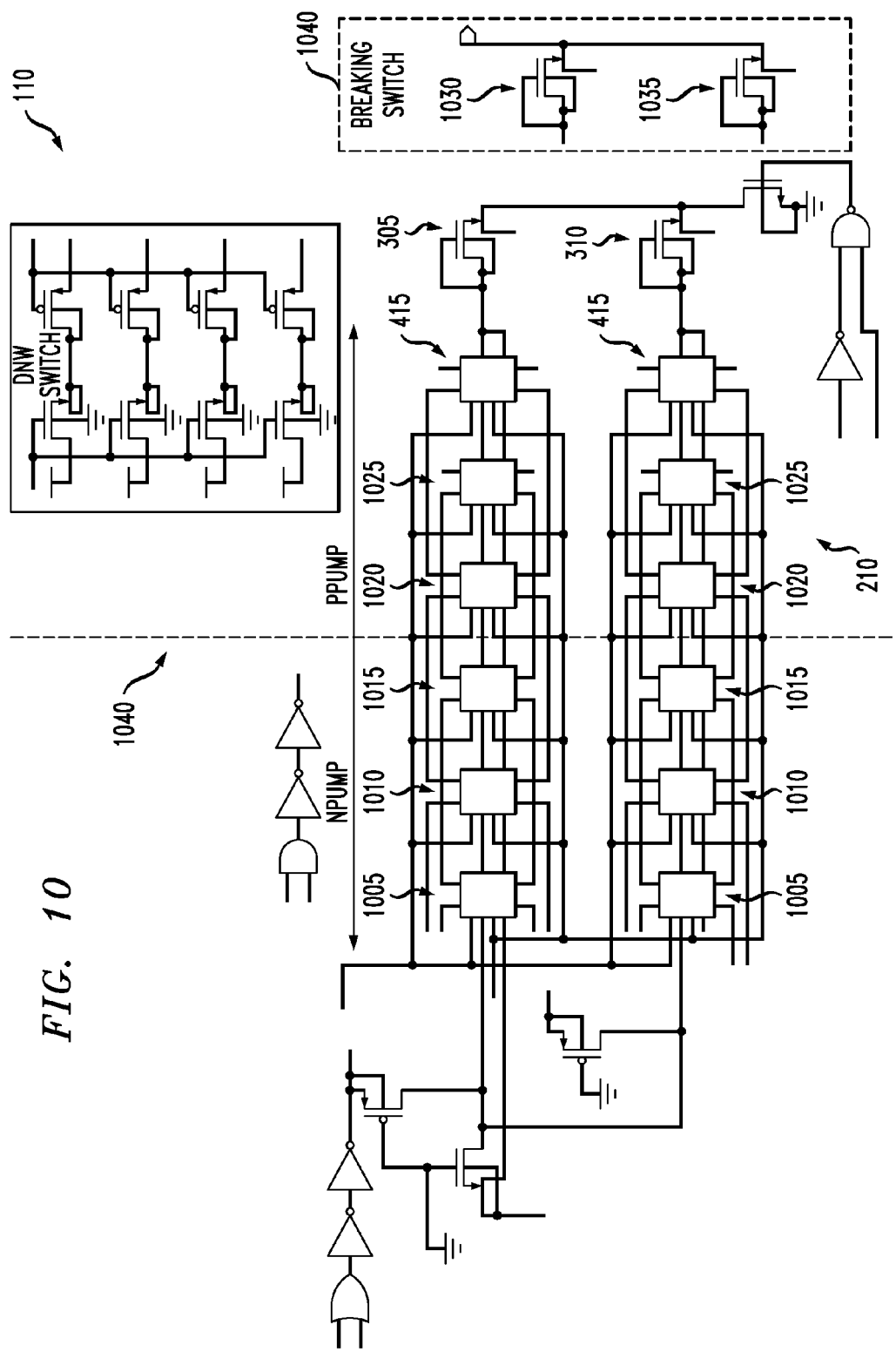
FIG. 10 is a block diagram that illustrates an embodiment of a bi-directional charge pump, such as that shown in FIG. 3, that can generate both negative and positive pump voltages at an intermediate pump stage.

FIG. 10 is a block diagram that illustrates an embodiment of a bi-directional charge pump 110, such as that shown in FIG. 3, that can generate both negative and positive pumps between pump stages 1005, 1010, 1015, 1020, 1025, 415. A breaking switch unit 1040 can be electrically connected between the pump stages 1005, 1010, 1015, 1020, 1025, 415 to generate both negative and positive pumps. The breaking switch unit 1040 includes one or more output switches 1030, 1035, which are similarly designed and functional as the diode circuit 305, 310 in FIG. 3. Accordingly, the output switches 1030, 1035 also include a diode having an input and output and a transistor being connected to the output of the diode and the ground potential 515. However, unlike the diode circuit 305, 310, the input of the diode of the output switches 1030, 1035 is electrically connected to an output of any intermediate pump stages, which are any pump stages other than the final pump stage.

In general, by using the output switches 1030, 1035, the output of any pump stage in a positive pump mode can be used as a positive pump. In addition, the output switches 1030, 1035 can be used as an input stage of a pump stage in a negative pump mode. The output switches 1030, 1035 can generate a positive pump and a negative pump at the same time.

Figure 11:
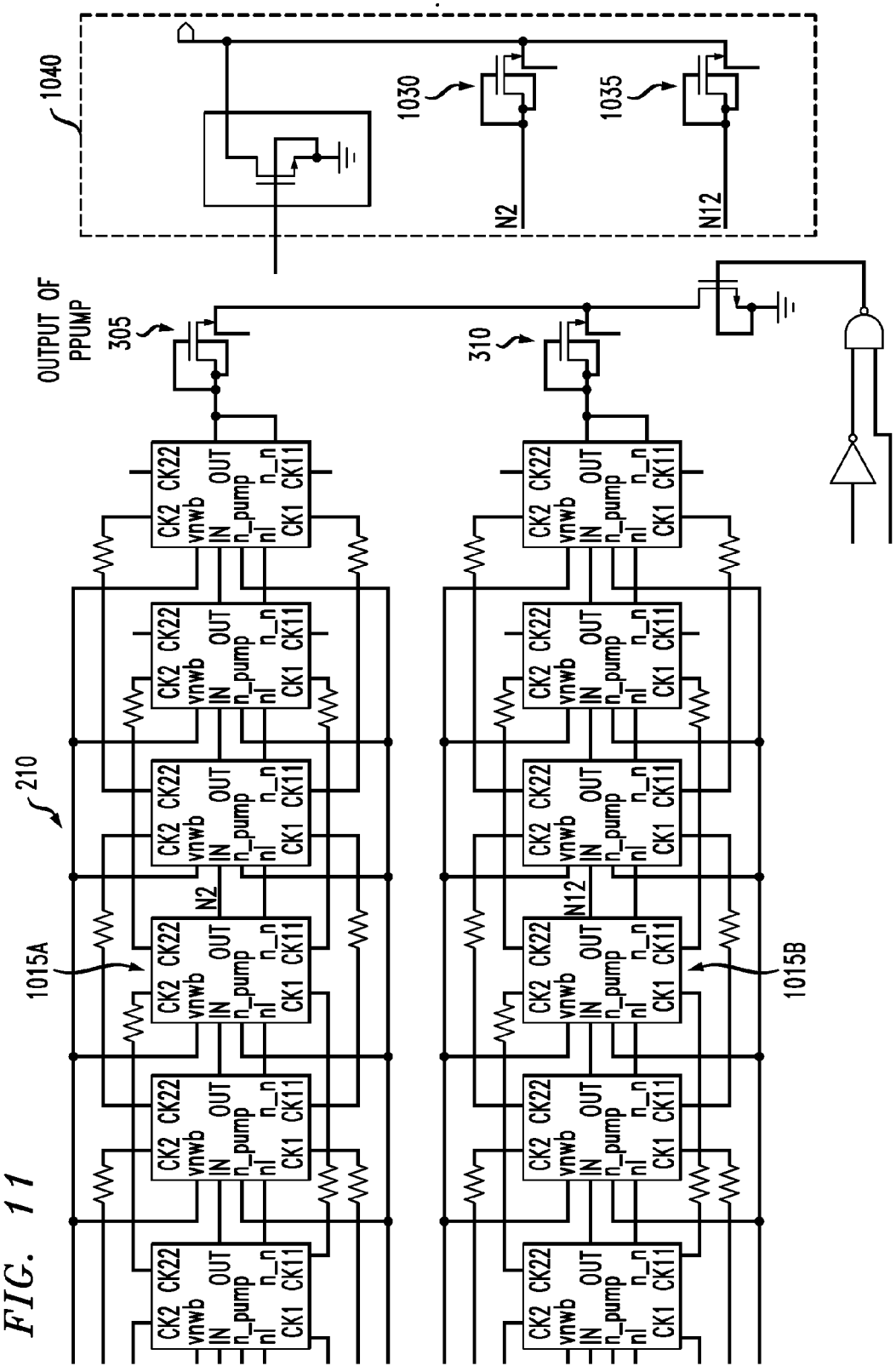
FIG. 11 is a more detailed block diagram that illustrates an embodiment of a bi-directional charge pump, such as that shown in FIG. 10.

FIG. 11 is a more detailed block diagram that illustrates an embodiment of a bi-directional charge pump 110, such as that shown in FIG. 10. In this example, the output of the third pump stage 1015A, B is electrically connected to the input of the output switches 1030, 1035 via node N2, N12, respectively. A positive voltage at the output of the third pump stage 1015A, B can be applied at the inputs of the diodes of the output switches 1030, 1035. The positive voltage switches on the diodes of the output switches 1030, 1035 discharge the positive voltage through the transistors of the output switches 1030, 1035 to the ground potential 515 and provide a second positive pump at a node that is located between the diode and the transistor of the output switches 1030, 1035. On the other hand, a negative voltage at the output of the third pump stage 1015A, B can be applied at the inputs of the diodes of the output switches 1030, 1035. This does not switch on the diodes of the output switches 1030, 1035. Accordingly, the negative voltage remains at the input of the diodes of the output switches 1030, 1035 and provides a second negative pump.

Figure 12:
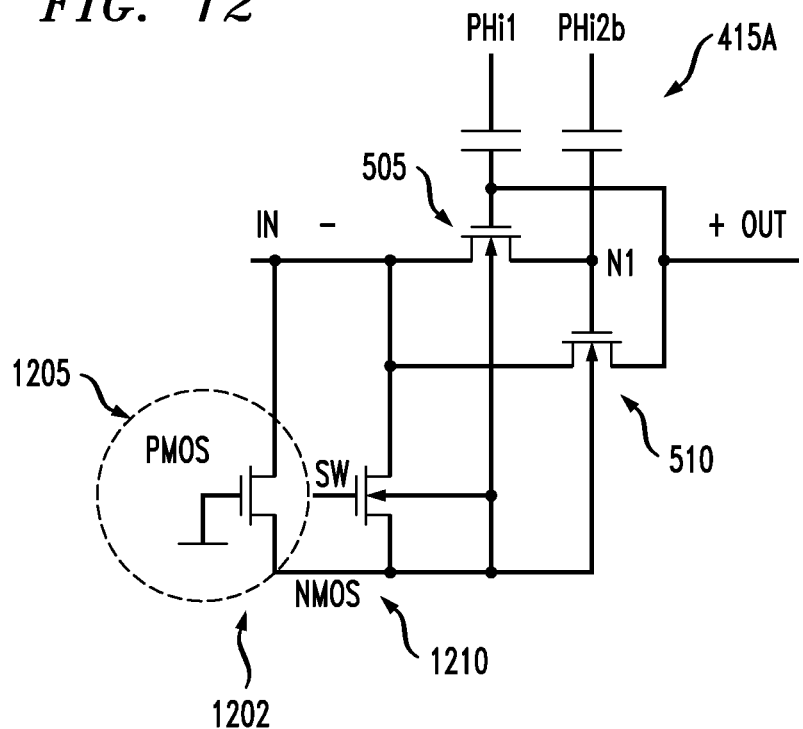
FIG. 12 is a schematic diagram that illustrates an embodiment of a pump stage, such as that shown in FIG. 5, having a P-well switch.

FIG. 12 is a schematic diagram that illustrates an embodiment of a pump stage 415A, such as that shown in FIG. 5, having a P-well switch 1202. The pump stage 415A includes a P-well switch 1202 that is connected to the deep N-well transistors 505, 510. In general, the P-well switch 1202 biases the P-well 605 of the deep N-well transistors 1305, 1405 (FIGS. 13 and 14) to a first negative voltage and a first positive voltage, respectively. The P-well switch 1202 includes a PMOS transistor 1205 and an NMOS transistor 1210 each having a source terminal, gate terminal and drain terminal. The drain terminals of the PMOS and NMOS transistors 1205, 1210 are electrically connected to the P-well 605 of the deep N-well transistors 1305, 1405. The gate and source terminals of the PMOS transistor 1205 are electrically connected to the ground potential 515 and the source terminal of the NMOS transistors 1210. The P-well switch 1202 connected to the deep N-well transistors 505, 510 can generate both a positive pump and a negative pump with high efficiency while avoiding bipolar turn on at the same time.

Figure 13:
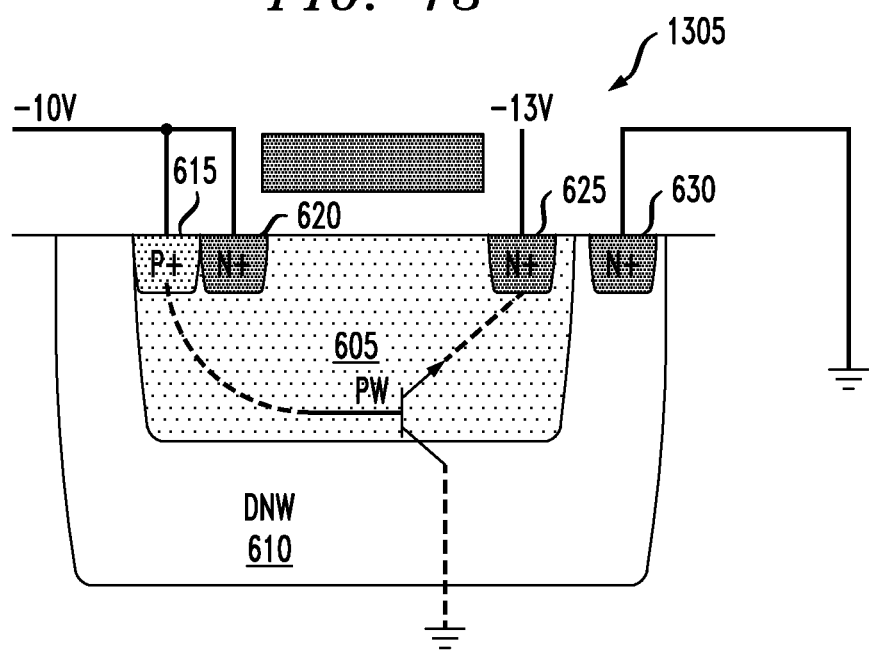
FIGS. 13 and 14 illustrate examples of structures of deep N-well transistors that are included in a pump stage, such as that shown in FIG. 12.
Figure 14:
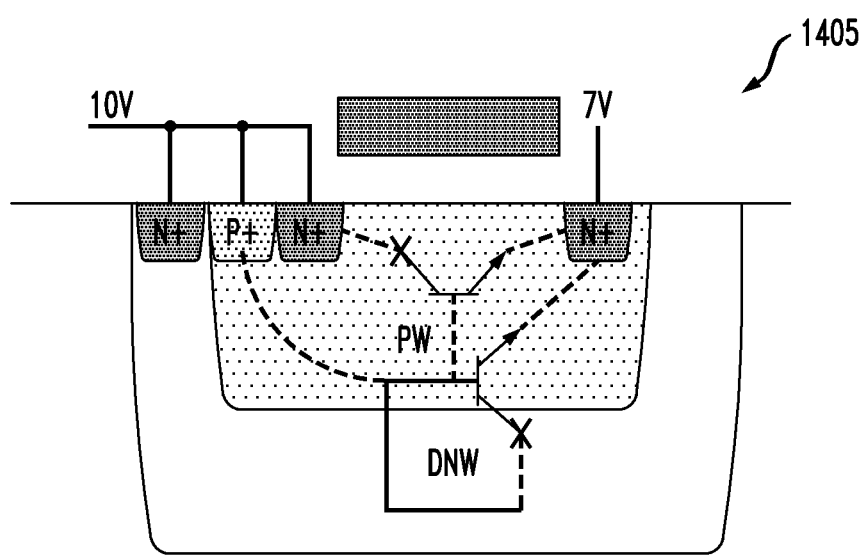

FIGS. 13 and 14 illustrate examples of structures of deep N-well transistors 1305, 1405 that are included in a pump stage 415A, such as that shown in FIG. 12. In FIG. 13, the deep N-well transistors 1305 operate in a negative pump mode where the input of the P-well switch 1202 and the gate of the NMOS transistor 1210 can be provided with a first negative voltage, e.g., −10V, and a second negative voltage e.g., −13V or another more negative voltage, respectively. The first and second negative voltages turn off the PMOS transistor 1205 and turns on the NMOS transistor 1210 in order to bias the P-well 605 of the deep N-well transistors 1305, 1405 to the first negative voltage that is based on the second negative voltage; thus, avoiding a bipolar turn on. The second negative voltage can be derived from the output of another pump stage of the charge pump 210 or from an internal node of another pump stage, such as at node (n1) of the pump stage 415A.

In FIG. 14, the deep N-well transistors 1305 operate in a positive pump mode where the input of the P-well switch 1202 and the gate of the NMOS transistor 1210 can be inputted with a first positive voltage, e.g., 10V, and a second positive voltage e.g., 7V, respectively. The first and second positive voltages turn on the PMOS transistor 1205 and turn off the NMOS transistor 1210 to bias the P-well 605 of the deep N-well transistors 1305, 1405 to the positive voltage, which enhances the pump's efficiency. It should be noted that the line at the gate of the NMOS transistor 1210 is labeled SW for switch control of the P-well switch 1202.

Figure 16:
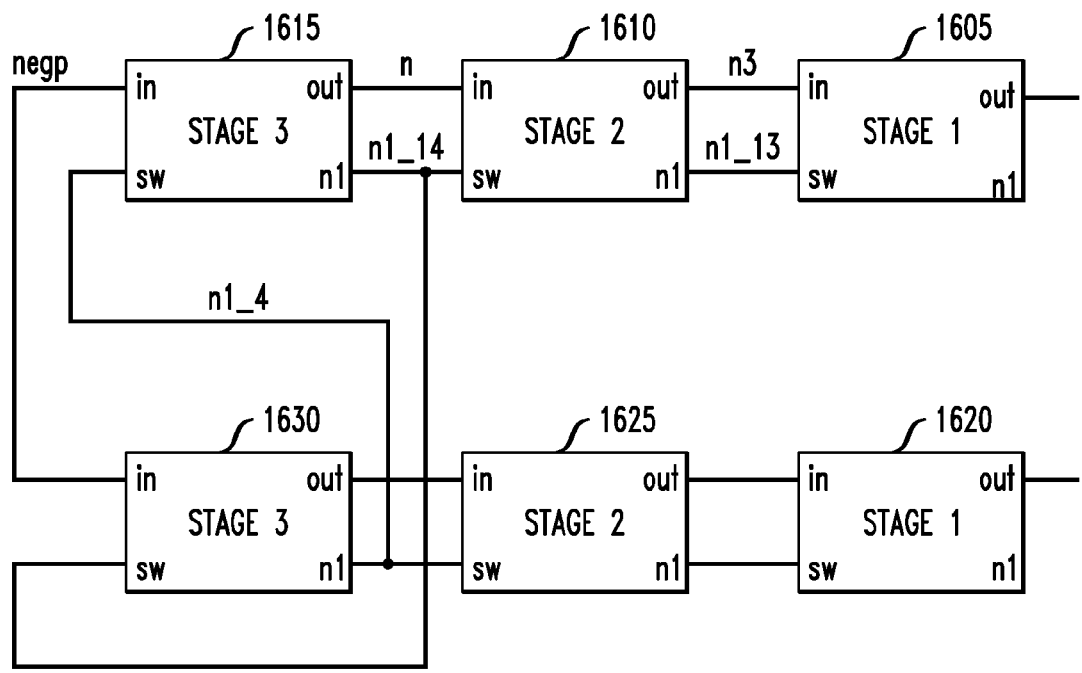

FIGS. 15 and 16 are block diagrams that illustrate embodiments of five (5) arrangements of pump stages, such as that shown in FIG. 12, that are in a negative pump mode. In FIG. 15, there are four (4) arrangements of the pump stages where each arrangement include three pump stages 1, 2, 3. Each pump stage 1, 2, 3 includes a P-well switch 1202 (FIG. 2) and the deep N-well transistors 505, 510 (FIG. 2); thus, having an input (in) terminal, output (out) terminal, switch control (sw) terminal, and internal node (n1) terminal. In the first arrangement, the signals from the internal node n1 terminal of the pump stage 2 are input into the sw terminal of the last pump stage 3. In the second arrangement, the signals from the internal node n1 of the pump stage 2 are input into the sw terminal of the first pump stage 1. In the third arrangement, the signals from the output terminal of the first pump stage 1 are input into its sw terminal. In the fourth arrangement, the signals from the output terminals of the pump stages are input into their respective sw terminals.

In FIG. 16, two parallel pump stages 1605, 1610, 1615, 1620, 1625, 1630 are electrically connected together at their last pump stages 1615, 1630. In this example, the signals from the internal nodes (n1) of the last pump stages 1615, 1630 are input into the each other's switch control (sw) terminals.

As described herein, an improved bi-directional charge pump 110 is presented utilizing a diode circuit 305, 310 (FIG. 3). This approach allows for a charge pump 210 to be used either as a positive pump or negative pump, or both as a positive pump and a negative pump at the same time. The diode circuit 305, 310 is designed with a ground potential 515 at the input stage of the pump stage in a negative pump mode, which results in high energy efficiency.

Additionally or alternatively, the improved bi-directional charge pump 110 can utilize deep N-well switches 815, 820, 905 that are electrically connected to the deep N-well transistors 505, 510 to avoid body effect and bipolar turn on in a positive pump mode and to bias the deep N-well transistors 505, 510 using negative voltages in a negative pump mode. In addition, the deep N-well switch 815, 820, 905 can also be used to break a pump stage into two pumps—one positive pump and one negative pump.

Additionally or alternatively, the improved bi-directional charge pump 110 can utilize a breaking switch unit 1040 that allows for splitting an intermediate pump stage into one positive pump and a negative pump at the same time. The breaking switch unit 1040 facilitates generating a positive pump at the output of any pump stage in a positive pump mode. In addition, the breaking switch unit 1040 can be used as an input stage of a pump stage in a negative pump mode.

Additionally or alternatively, the improved bi-directional charge pump 110 can utilize a P-well switch 1202 that is connected to the deep N-well transistors 505, 510 for generating both a positive pump and a negative pump with high efficiency while avoiding bipolar turn on at the same time, respectively.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit comprising:
   a load circuit;
   a bi-directional charge pump being electrically connected to the load circuit, the bi-directional charge pump having an input circuit and output circuit, and one or more pump stages coupled between the input circuit and the output circuit of the bi-directional charge pump, wherein the output circuit includes a diode having an input and output and a transistor being connected to the output of the diode and a ground potential; and
   one or more output switches that include a second diode having an input and an output and a second transistor connected to the output of the second diode and to the ground potential,
   wherein the input of the diode is electrically connected to the pump stages, the input of the second diode is electrically connected to an output of any intermediate pump stages, a positive voltage at the output of the intermediate pump stages is input at the input of the second diode, and the positive voltage switches on the second diode, which discharges the positive voltage through the second transistor to ground potential and provides a second positive pump (P-pump) that is located between the second diode and the second transistor.

2. The integrated circuit of claim 1, wherein the bi-directional charge pump is configured such that a positive voltage applied at the input of the diode and switches on the diode, which discharges the positive voltage through the transistor to the ground potential and provides a first positive pump (P-Pump) that is located between the diode and the transistor.

3. The integrated circuit of claim 2, wherein the first P-Pump is used as an input voltage of a positive pump.

4. The integrated circuit of claim 2, wherein the bi-directional charge pump is configured such that a negative voltage at the input of the diode does not switch on the diode and remains at the input of the diode, wherein the negative voltage provides a first negative pump (N-Pump).

5. The integrated circuit of claim 4, wherein the first N-Pump is used as an input voltage of a negative pump.

6. The integrated circuit of claim 1, wherein the diode includes an NMOS transistor having a gate terminal, source terminal, and drain terminal, wherein the gate and source terminals are electrically connected to the one or more pump stages and the drain terminal is electrically connected to the transistor of the output circuit.

7. The integrated circuit of claim 6, wherein the transistor of the output circuit includes an NMOS transistor having a gate terminal, source terminal, and drain terminal, wherein the source and drain terminals are electrically connected to the diode and the ground potential, respectively.

8. The integrated circuit of claim 1, wherein each of the one or more pump stages includes at least one deep N-well transistors, wherein each structure of the at least one deep N-well transistors includes a P-well, a deep N-well, and multiple N+ and P+ type semiconductor materials, wherein the P-well is embedded within the deep N-well, wherein the multiple N+ and P+ type semiconductor materials are embedded within the P-well and the deep N-well and located adjacent to a top surface of the P-well and the deep N-well.

9. The integrated circuit of claim 8, wherein the multiple N+ and P+ type semiconductor materials include NPNN layer pellets and/or PNNN layer pellets, wherein the PNN pellets and the other N pellet are embedded in the P-well and the deep N-well, respectively.

10. The integrated circuit of claim 9, wherein each of the one or more pump stages includes a first deep N-well switch and a second deep N-well switch that are electrically connected together to their respective source terminal and drain terminal, wherein the first deep N-well switch turns on and the second deep N-well switch turns off to connect the P-well to the deep N-well of the deep N-well transistors in a positive pump mode via the other N pellet of the deep N-well and the PN pellets of the P-well, wherein the second deep N-well switch turns on and the first deep N-well switch turns off to connect the deep N-well transistors to the ground potential in a negative pump mode via the other N pellet of the deep N-well of the deep N-well transistors.

11. The integrated circuit of claim 10, wherein the first deep N-well switch and the second deep N-well switch include NMOS transistors and/or PMOS transistors.

12. The integrated circuit of claim 8, wherein each pump stage includes a P-well switch that is connected to the deep N-well transistors, wherein in a positive pump mode and a negative pump mode, the P-well switch biases the P-well of the deep N-well transistors to a first positive voltage and a first negative voltage, respectively.

13. The integrated circuit of claim 12, wherein the P-well switch includes a PMOS transistor and an NMOS transistor each having a source terminal, gate terminal and drain terminal, wherein the drain terminals of the PMOS and NMOS transistors are electrically connected to the P-well of the deep N-well transistors, wherein the gate and source terminals of the PMOS transistor are electrically connected to the ground potential and the source terminal of the NMOS transistors, wherein the gate of the NMOS transistor is electrically connected to a second negative voltage, wherein the PMOS transistor is turned off and the NMOS transistor is turned on to bias the P-well of the deep N-well transistors to the first negative voltage that is based on the second negative voltage to avoid a bipolar turn on, wherein the PMOS transistor is turned on and the NMOS transistor is turned off to bias the P-well of the deep N-well transistors to the first positive voltage to enhance the pump's efficiency.

14. The integrated circuit of claim 13, wherein the second negative voltage is derived from an output of another pump stage of the bi-directional charge pump.

15. The integrated circuit of claim 14, wherein the second negative voltage is an internal node of the another pump stage.

16. The integrated circuit of claim 13, wherein the second negative voltage is an internal node of the pump stages.

17. The integrated circuit of claim 1, wherein a negative voltage at the output of the intermediate pump stages is inputted at the input of the second diode does not switch on the second diode and remains at the input of the second diode, wherein the negative voltage provides a second negative pump (N-Pump).

18. An integrated circuit comprising:
a load circuit; and
a bi-directional charge pump being electrically connected to the load circuit, the bi-directional charge pump having an input circuit and output circuit, and one or more pump stages coupled between the input circuit and the output circuit of the bi-directional charge pump, wherein each pump stage includes one or more deep N-well transistors, wherein each structure of the deep N-well transistors includes a P-well, a deep N-well, and multiple N+ and P+ type semiconductor materials, wherein the P-well is embedded within the deep N-well, wherein the multiple N+ and P+ type semiconductor materials are embedded within the P-well and the deep N-well and located adjacent to a top surface of the P-well and the deep N-well,
wherein each pump stage includes a first deep N-well switch and a second deep N-well switch that are connected to their respective source terminal and drain terminal, wherein the first deep N-well switch turns on and the second deep N-well switch turns off to connect the P-well to the deep N-well of the deep N-well transistors in a positive pump mode via the other N pellet of the deep N-well and the PN pellets of the P well, wherein the second deep N-well switch turns on and the first deep N-well switch turns off to connect the deep N-well transistors to a ground potential in a negative pump mode via the other N pellet of the deep N-well of the deep N-well transistors.

19. The integrated circuit of claim 18, wherein the multiple N+ and P+ type semiconductor materials include NPNN layer pellets and/or PNNN layer pellets, wherein the PNN pellets and the other N pellet are embedded in the P-well and the deep N-well, respectively.

20. The integrated circuit of claim 18, wherein the first deep N-well switch and the second deep N-well switch include NMOS transistors and/or PMOS transistors.

21. An integrated circuit comprising:
a load circuit; and
a charge pump having an input circuit and output circuit coupled to the load circuit, and one or more pump stages coupled between the input circuit and the output circuit of the charge pump, wherein each pump stage includes one or more output switches that include a diode having an input and output and a transistor being connected to the output of the diode and a ground potential,
a P-well switch that is connected to one or more deep N-well transistors, the P-well switch including a PMOS transistor and an NMOS transistor each having a source terminal, a gate terminal and a drain terminal, the drain terminals of the PMOS and NMOS transistors are electrically connected to the P-well of the deep N-well transistors, the gate and source terminals of the PMOS transistor are electrically connected to the ground potential and the source terminal of the NMOS transistors, the gate of the NMOS transistor is electrically connected to a second negative voltage, wherein the input of the diode is electrically connected to an output of any intermediate pump stages, wherein in a positive pump mode and a negative pump mode, the P-well switch biases a P-well of the deep N-well transistors to a first positive voltage and a first negative voltage, respectively, and wherein the PMOS transistor is turned on and the NMOS transistor is turned off to bias the P-well of the deep N-well transistors to the first positive voltage to enhance the pump's efficiency, wherein the PMOS transistor is turned off and the NMOS transistor is turned on to bias the P-well of the deep N-well transistors to the first negative voltage that is based on the second negative voltage to avoid a bipolar turn on.

22. The integrated circuit of claim 21, wherein a positive voltage at the output of the intermediate pump stages is inputted at the input of the diode, wherein the positive voltage switches on the diode, which discharges the positive voltage through the transistor to the ground potential and provides a positive pump (P-Pump) that is located between the diode and the transistor.

23. The integrated circuit of claim 21, wherein a negative voltage at the output of the intermediate pump stages is inputted at the input of the diode does not switch on the diode and remains at the input of the diode, wherein the negative voltage provides a negative pump (N-Pump).

24. The integrated circuit of claim 21, wherein the second negative voltage is derived from another pump stage of the charge pump.

25. The integrated circuit of claim 24, wherein the second negative voltage is an internal node of the another pump stage.

26. The integrated circuit of claim 21, wherein the second negative voltage is an internal node of the pump stages.

* * * * *